United States Patent [19]

Immer et al.

[11] 4,101,974

[45] Jul. 18, 1978

[54] PERSONALIZABLE READ-ONLY MEMORY

[75] Inventors: Dennis L. Immer, Mesa; Michael S. Millhollan, Tempe; Ronald L. Treadway, Scottsdale, all of Ariz.

[73] Assignee: Motorola, Inc., Schaumburg, Ill.

[21] Appl. No.: 838,420

[22] Filed: Sep. 30, 1977

Related U.S. Application Data

[63] Continuation of Ser. No. 645,575, Dec. 31, 1975, abandoned.

[51] Int. Cl.² .............................................. G11C 17/00
[52] U.S. Cl. ..................................................... 365/96
[58] Field of Search ....................... 365/96; 357/45, 86

[56] References Cited

U.S. PATENT DOCUMENTS

| | | | |
|---|---|---|---|
| 3,529,299 | 9/1970 | Chung et al. ............................. | 365/96 |
| 3,611,319 | 10/1971 | Hyatt ..................................... | 365/96 |
| 3,872,450 | 3/1975 | Reynolds ................................ | 365/96 |
| 3,976,983 | 8/1976 | Moussie .................................. | 365/96 |

FOREIGN PATENT DOCUMENTS 1,131,210  10/1968  United Kingdom ................... 365/96

Primary Examiner—Stuart N. Hecker
Attorney, Agent, or Firm—Kenneth R. Stevens

[57] ABSTRACT

A programmable read-only memory circuit including a plurality of fusible link memory cells is disclosed in which a first auxiliary current source is employed to selectively isolate a cell location to be volatized during memory personalization and a second auxiliary current source is employed to volatize or personalize a fusable link in the selected memory cell for insuring complete volatilization of the fusible link.

4 Claims, 1 Drawing Figure

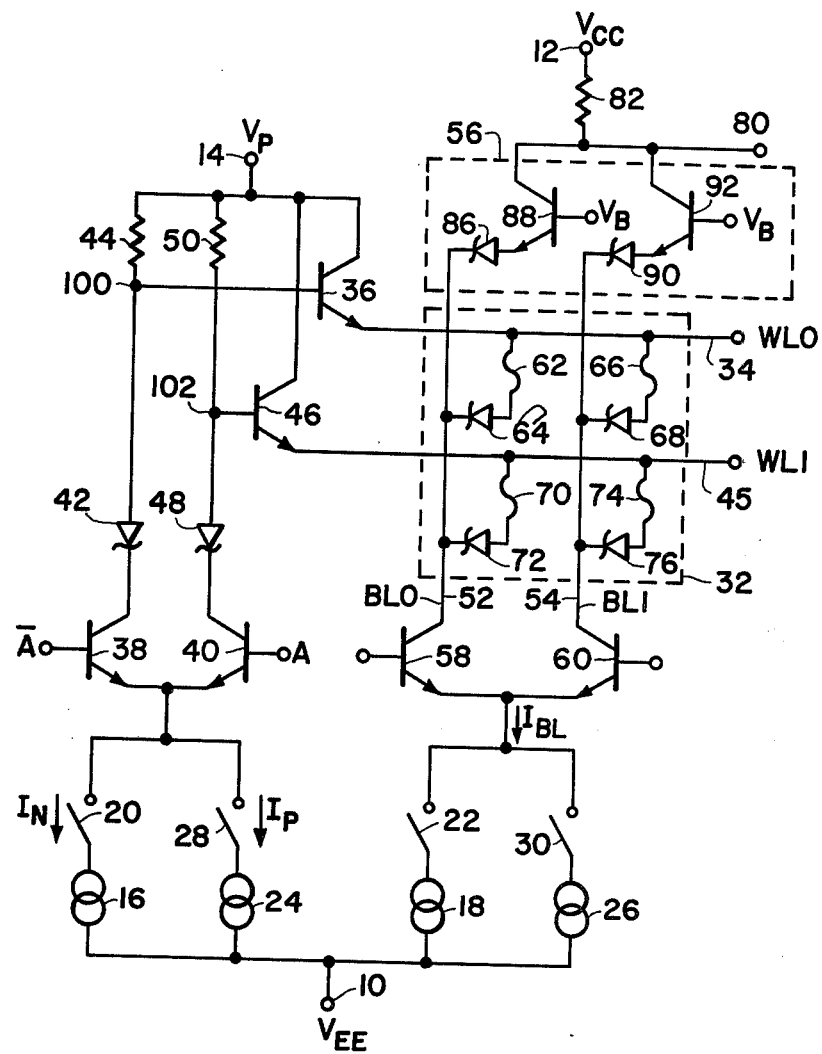

PERSONALIZABLE READ-ONLY MEMORY

This is a continuation of application Ser. No. 645,575, filed Dec. 31, 1975, now abandoned.

BACKGROUND OF THE INVENTION

It is an advantage to characterize a personalizable read-only memory using only a current source, as opposed to a voltage source, as the power increases as the value of the resistive fusable link increases. With a constant voltage source, the power employed to volatize the fusable link decreases as the value of the fusable link resistive element increases. Higher reliability in opening a desired predetermined fusable link is thus attained by employing constant current volatizing power sources.

In a memory matrix it is desirable to volatize only certain predetermined cell locations. Prior techniques for personalizing a memory often create "sneak paths" which allow fusable elements to be opened which are intended to remain intact. This problem is further compounded by the fact that the fusable elements in many programmable or personalizable read-only memories are typically in the range of 200 ohms and it takes anywhere from 30 to 40 milliamps to volatize or open the fusable links at 8 volts or greater. These voltage swings are incompatible with emitter coupled logic circuit type read-only memories which normally attain voltage swings in the range of 800 millivolts.

It is therefore an object of the present invention to provide a personalizable or programmable read-only memory which can reliably select the fusable element to be opened using emitter type logic and then readily allow the selected memory location to be volatized by an auxiliary current source so as to increase the likelihood of complete volatilization or opening of the fusable link.

BRIEF DESCRIPTION OF THE DRAWINGS

The sole FIGURE illustrates an electrical schematic of the personalizable read-only memory of the present invention.

DESCRIPTION OF THE PREFERRED EMBODIMENT

The circuit employs three separate voltage sources shown as $V_{EE}$ connected to terminal 10, typically −5.4 volts, voltage source $V_{CC}$ of 0.0 volts connected to terminal 12 and a third voltage source $V_P$ applied to terminal 14 normally residing at 0.0 volts during normal operation of the read-only memory, that is, after the memory has been personalized, and during personalization at +12.0 volts. Similarly, a pair of constant current sources 16 and 18 are coupled to the circuit during normal operation via their attendant switches schematically shown at 20 and 22, respectively.

The current sources 24 and 26 constitute auxiliary current sources which are switched into the circuit by means of their attendant switches 28 and 30, respectively, during personalization of the memory 32.

A word line 34 (WL0) couples to a pair of memory locations and to the emitter of transistor 36. A differential pair of transistors constituted by transistors 38 and 40 are adapted to receive addressing signals $\overline{A}$ and A at their respective base terminals. The transistors 38 and 40 are commonly coupled at their emitter terminals and are selectively connected to the constant current sources 16 and 24 as will be hereinafter described in greater detail. The base of transistor 36 is coupled intermediate to Schottky diode 42 and load resistor 44. Similarly, the collector terminal of transistor 40 is coupled to word line 45 and designated (WL1) by means of transistor 46 whose base terminal is connected intermediate to Schottky diode 48 and load resistor 50.

A pair of bit lines 52 and 54 corresponding to bit lines 0 and bit line 1 (BL0, BL1) are coupled between output sensing circuitry 56, the memory 32 and a pair of differentially connected bit line transistors 58 and 60. The base of transistor 58 in the illustrated example receives a low logic level and the base of transistor 60 receives a high logic level for purposes of description.

For the purpose of simplicity only a 2 by 2 matrix of memory cells has been shown with each of the locations initially intact and each constituting a fusable resistive link and a Schottky diode shown respectively in pairs as 62, 64; 66, 68; 70, 72 and 74, 76.

The state of the memory 32 is sensed at output terminal 80 coupled to $V_{CC}$ by means of resistor 82 and the output sensing circuitry 56. The state of BL0 line designated 52 is sensed by means of Schottky diode 86 coupled to transistor 88 which is in turn coupled to output line 80. Similarly, the BL1 or line 54 is sensed by means of Schottky diode 90 coupled to the emitter of transistor 92 and in turn to output line 80. The value of $V_B$ is selected midway between those of nodes 100 and 102.

During normal operation fusable element 74 is intact and current sources 16 and 18 are coupled to the rest of the circuitry via their switches 20 and 22 and auxiliary current sources 24 and 26 are out of the circuit.

Assuming $\overline{A}$ is at an up level and A is at a down level, then transistor 38 is on and transistor 40 is off and therefore, node 100 is low and node 102 is high. Since the two emitters of transistors 58 and 60 are tied together, the one whose base is at the highest potential will conduct current through the bit line. Accordingly, all the bit line current will be conducted through line BL1. Since node 102 is higher than node 100 and $V_B$ all the bit line current will be channeled down through transistor 46, fusable element 74, Schottky diode 76 and down through transistor 60.

On the other hand, if under the same signal conditions fusable element 74 is open or volatized then all of the bit line current on line BL1 would be provided by transistor 92 and Schottky diode 90. Thus it can be seen that with a fusable element intact the collector current of the sensing transistors 92 or 88 equals zero and all of the bit line current is supplied either via transistor 36 or 46 depending upon the input signal conditions. Conversely, with the fusable element programmed or personalized to an open state, then all of the bit line current on either lines BL1 or BL0 is provided by the respective transistor 92 or 88. These current conditions are translated by resistor 82 to output line 80 to indicate the state of the memory element as being either open or closed according to the personalization procedure as will be hereinafter described.

Assuming it is desired to open fusable elements 74, the following procedures occur. Binary levels as previously described are established at the bases of transistors 38, 40, 58 and 60 in order to select or isolate fusable element 74. The voltage source $V_P$ which during normal operation remains at 0.0 volts is raised to +12.0 volts. Also, the contact 20 is opened and a first auxiliary current source 24 of approximately an order of magnitude larger than normal operating current source 16 is connected to the circuit by closing switch 28. With these conditions the selected node 102 rises to approximately +12.0 volts and the unselected node 100 drops to a value significantly lower than 12.0 volts due to the insertion of current source 24 and the added voltage drop across resistor 44. Without the substitution of current source 24 for current source 16 the voltage drop across the unselected elements, for example resistor 44, would not have been sufficiently large to insure against sneak paths during subsequent personalization or opening of the element 74.

For example, in a larger 32 line decode implementation of the present invention 31 lines would receive current and one line would not receive current. In a typical implementation of the and gate decoder (U.S. Pat. No. 3,914,620) the value of current source 16 would be around 6 milliamps. Therefore, each of the unselected and gates would receive approximately 1 milliamp of current through their associated resistor. In the present invention, when implemented in 1 out of 32 decode mode, the value of $I_p$ is increased to approximately 75 milliamps during programming. This increase in current $I_p$ increases the drops across the gate resistors to insure that the voltage established at the unselected word lines is sufficiently low to avoid any sneak path associated with the selected word line.

Normally the value of current source 18 for normal operation is somewhere in the order of 2 milliamps which of course is insufficient to volatize or open a fusable element during personalization. Thus once the fusable element such as 74 has been isolated as previously described, switch 22 is opened and switch 30 is closed so to insert a second auxiliary current source 26 which in the preferred embodiment is approximately 40 milliamps of current which is sufficient to completely volatize the element 74.

Thus it can be seen that in the present invention a suitable voltage differential is set up by inserting current source 24 for isolating the element to be volatized and then a second current source 26 is inserted to perform the actual fusing or volatizing of the resistive element.

Also it can be seen that a Schottky barrier diode having a theoretical breakdown of up to 20 bolts is employed in the memory array (as opposed to a transistor) in order to avoid the possibility of emitter base breakdown when operating in the voltage ranges of the present invention.

What is claimed is:

1. A personalizable read-only memory having a plurality of bit lines and word lines comprising:
   (a) a plurality of interconnected cells, each cell comprising a fusible element and a unilaterally conducting device, each cell being coupled between an associated bit line and an associated word line, each of said unilaterally conducting devices being poled for conducting current between its associated word line and its associated bit line,
   (b) a plurality of word line transistors, each having its emitter terminal coupled to a respective word line,
   (c) word line decoder means coupled to the base terminals of said word line transistors,
   (d) a bit line decoder means coupled to said plurality of bit lines, said word line decoder means and said bit line decoder means being responsive for reading information from said memory means during normal operation, and
   (e) a first auxiliary current source coupled to said word line decoder means and being selectively disabled during normal operation, said first auxiliary current source being selectively coupled to said word line transistors during personalization for establishing a predetermined voltage differential between said plurality of word lines for selecting and isolating a predetermined fusible element prior to personalization thus eliminating the likelihood of erroneous personalization of other nonselected fusible elements.

2. A personalizable read-only memory as in claim 1 further comprising:
   (a) first and second current sources coupled to said word line decoder means and bit line decoder means, respectively, and being enabled during normal operation.

3. A personalizable read-only memory as in claim 2 further comprising:
   (a) a second auxiliary current source coupled to said bit line decoder means and being capable of supplying at least a magnitude greater current than said first and second current sources and being disabled during normal operation and enabled during personalization for opening a selected fusible element, and
   (b) terminal means coupled to said word line decoder means for receiving a first voltage during personalization and a second voltage during normal operation, said first voltage being of a sufficient magnitude for opening a selected fusible element in conjunction with said at least a magnitude greater current, and said second voltage being less than said first voltage and of a magnitude for minimizing power dissipation during normal operation.

4. A personalizable read-only memory as in claim 3 wherein:
   (a) said bit line decoder means is selectively enabled for coupling said second auxiliary current source to any one of a selected plurality of fusible elements.

* * * * *